(12) United States Patent
Tomida (10) Patent No.: US 12,139,342 B2
(45) Date of Patent: Nov. 12, 2024

(54) ARTICLE TRANSPORT VEHICLE

(71) Applicant: Daifuku Co., Ltd., Osaka (JP)

(72) Inventor: Daichi Tomida, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 368 days.

(21) Appl. No.: 17/672,902

(22) Filed: Feb. 16, 2022

(65) Prior Publication Data

US 2022/0258982 A1 Aug. 18, 2022

(30) Foreign Application Priority Data

Feb. 17, 2021 (JP) ................................. 2021-023358

(51) Int. Cl.
*B65G 17/20* (2006.01)
*H01L 21/677* (2006.01)

(52) U.S. Cl.
CPC ........ *B65G 17/20* (2013.01); *H01L 21/67733* (2013.01)

(58) Field of Classification Search
CPC .... B66C 1/28; B66C 1/30; B66C 1/62; B66C 11/06; B66C 11/12; B66C 11/04; B66C 13/04; B66C 13/06; B66C 15/00; B66C 15/02; B66C 19/00; B65G 1/0457; B65G 17/20; B65G 35/00; B65G 2201/0297; H01L 21/67733; H01L 21/67253; H01L 21/6773; H01L 21/67724; H01L 21/677
USPC ...................................................... 212/272
See application file for complete search history.

(56) References Cited

U.S. PATENT DOCUMENTS

| | | | |
|---|---|---|---|
| 7,210,589 B2* | 5/2007 | Iizuka ..................... | B66C 13/06 212/331 |
| 2011/0062103 A1* | 3/2011 | Honda ...................... | B61B 3/02 212/71 |
| 2013/0213257 A1* | 8/2013 | Yamamoto ................ | B61B 3/02 105/150 |
| 2016/0133488 A1 | 5/2016 | Tomida | |
| 2017/0243775 A1* | 8/2017 | Kobayashi ........ | H01L 21/67369 |
| 2019/0241406 A1* | 8/2019 | Kobayashi ............... | B65G 1/04 |
| 2020/0223455 A1* | 7/2020 | Kobayashi ........... | B65G 1/0464 |
| 2020/0269882 A1* | 8/2020 | Kobayashi ........... | B65G 1/0457 |
| 2020/0339162 A1* | 10/2020 | Kobayashi .......... | H01L 21/6773 |

FOREIGN PATENT DOCUMENTS

| | | | | |
|---|---|---|---|---|
| JP | 2006298535 A | 11/2006 | | |
| JP | 201694263 A | 5/2016 | | |
| JP | 2018039659 A | * 3/2018 | ........... B65G 1/0492 |
| JP | 2018125411 A | 8/2018 | | |
| JP | 2020169090 A | 10/2020 | | |

* cited by examiner

*Primary Examiner* — Michael R Mansen
*Assistant Examiner* — Henrix Soto
(74) *Attorney, Agent, or Firm* — The Webb Law Firm (57) ABSTRACT

An article transport vehicle includes a shake prevention mechanism configured to prevent an article that is housed in a housing portion from shaking in a target direction. The shake prevention mechanism includes an abutting portion and an abutting support portion that is coupled to the housing portion and supports the abutting portion. The abutting support portion includes a second elastic support portion configured to elastically support the abutting portion in the vertical direction relative to the housing portion.

7 Claims, 5 Drawing Sheets

ARTICLE TRANSPORT VEHICLE

CROSS-REFERENCE TO RELATED APPLICATION

This application claims priority to Japanese Patent Application No. 2021-023358 filed Feb. 17, 2021, the disclosure of which is hereby incorporated by reference in its entirety.

BACKGROUND OF THE INVENTION

1. Field of the Invention

The present invention relates to an article transport vehicle for transporting articles.

2. Description of the Related Art

For example, JP 2006-298535A (Patent Document 1) discloses an article transport vehicle that holds an article using a pair of chuck portions that are provided on a holding body that is lifted and lowered by an elevation drive unit, and transports the held article to various places.

According to the technique disclosed in Patent Document 1, an elastic body is provided on the holding body that holds an article, and the article is supported using this elastic body, so that vibration of the article transport vehicle is prevented from being directly transmitted to the article. According to this technique, the transmission of vibration to the article in a vertical direction is particularly mitigated.

With the article transport vehicle disclosed in Patent Document 1, it is impossible to prevent an article in the state of being held by the holding body from shaking in a direction orthogonal to the vertical direction (for example, a travel direction, hereinafter referred to as an "orthogonal direction"). Therefore, in order to suppress such shaking in the orthogonal direction, it is conceivable of further providing a mechanism for supporting the article in the orthogonal direction. By providing such a mechanism, it is possible to suppress the shake of the article and to stably hold the article. However, if the vertical movement of the article is restricted by supporting the article in the orthogonal direction, the function of the elastic body provided on the holding body of mitigating the transmission of vertical vibration to the article is hindered.

In view of the above circumstances, it is desired to realize an article transport vehicle capable of stably holding an article and appropriately achieving the function of the holding body of mitigating the transmission of vertical vibration to the article.

A technology for solving the above problem is as follows: an article transport vehicle that transports an article, comprising:
a travel body configured to travel along a travel path;
a holding body coupled to the travel body and configured to hold the article so that the article is in a state of being suspended therefrom;
a housing portion coupled to the travel body and configured to house the article held by the holding body; and
a shake prevention mechanism configured to prevent the article housed in the housing portion from shaking in a target direction that is a direction orthogonal to a vertical direction,
wherein the holding body includes a main portion, an article holding portion configured to hold the article, and a first elastic support portion configured to elastically support the article holding portion in the vertical direction relative to the main portion,
the shake prevention mechanism includes an abutting portion, an abutting support portion coupled to the housing portion and supporting the abutting portion, and an abutting drive unit configured to change a position of the abutting portion to an abutting position at which the abutting portion abuts against a side surface of the article housed in the housing portion and a separation position at which the abutting portion is separated from the side surface, and
the abutting support portion includes a second elastic support portion configured to elastically support the abutting portion in the vertical direction relative to the housing portion.

With this configuration, the abutting portion of the shake prevention mechanism abuts against the side surface of the article held by the holding body, and the shake of the article in the target direction can be suppressed. Therefore, it is possible to stably hold the article. In addition, the abutting support portion that supports the abutting portion includes a second elastic support portion configured to elastically support the abutting portion in the vertical direction relative to the housing portion. Therefore, when the article holding portion elastically supported by the first elastic support portion in the vertical direction elastically moves in the vertical direction, i.e., when the article held by the article holding portion elastically moves in the vertical direction, the abutting portion abutting against the article can also elastically move in the vertical direction to follow the article. Therefore, it is possible to enable the first elastic support portion of the holding body to properly achieve the function thereof of mitigating the transmission of vertical vibration to the article.

Further features and advantages of the technique according to the present disclosure will be made more apparent by the following illustration of exemplary and non-limiting embodiments described with reference to the drawings.

DETAILED DESCRIPTION OF PREFERRED EMBODIMENTS

The article transport vehicle is an apparatus for transporting an article. Such an article transport vehicle can be used in a semiconductor manufacturing factory, for example, and examples of articles to be transported include an FOUP (Front Opening Unified Pod) for accommodating a semiconductor wafer, a reticle pod for accommodating a reticle, and so on. The following describes embodiments of an article transport vehicle with reference to the drawings.

Figure 1:
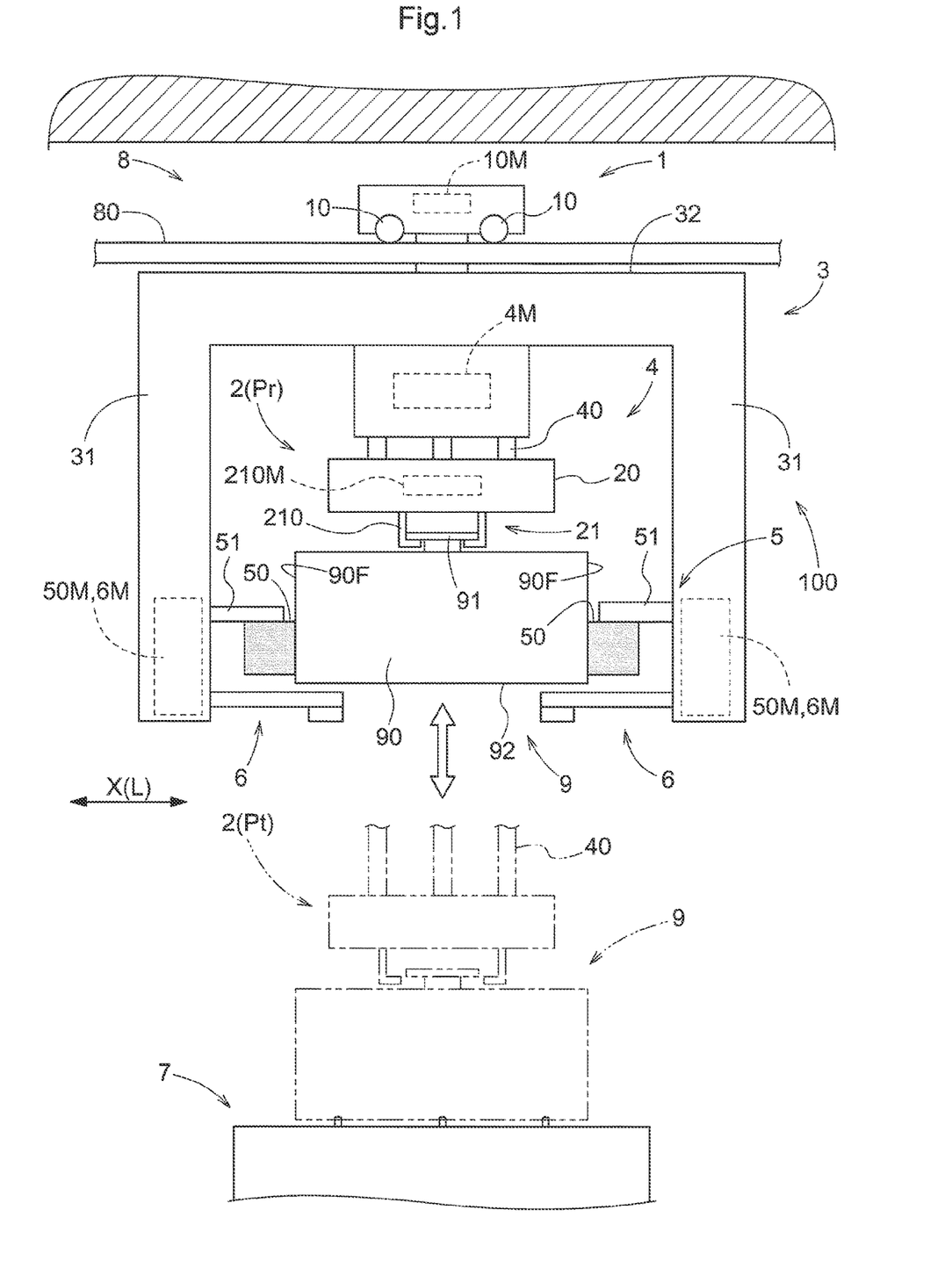
FIG. 1 is a front view of an article transport vehicle.

As shown in FIG. 1, an article transport vehicle 100 includes a travel body 1 configured to travel along a travel path 8, a holding body 2 coupled to the travel body 1 and configured to hold an article 9 so that the article 9 is in a state of being suspended therefrom, and a housing portion 3 coupled to the travel body 1 and configured to house the article 9 held by the holding body 2.

In the present embodiment, the travel path 8 is defined by a travel rail 80 that is provided near the ceiling. That is to say, in the present embodiment, the article transport vehicle 100 is formed as a so-called ceiling transport vehicle.

The travel body 1 includes a plurality of travel wheels 10, and a travel drive unit 10M for driving at least one of the plurality of travel wheels 10. The travel drive unit 10M includes a motor and a mechanism for rotating the travel wheel 10. The travel drive unit 10M drives to rotate the travel wheel 10 to be driven, propulsive force is applied to the travel body 1 in a travel direction L.

In the present embodiment, the article transport vehicle 100 is provided with an elevation device 4 that raises and lowers the holding body 2, and is configured to transfer an article 9 to and from a transfer target position 7 that is located below the travel rail 80. In this example, the elevation device 4 includes an elevation belt 40 that is coupled to the holding body 2, and an elevation drive unit 4M that winds or feeds the elevation belt 40 to raise and lower the holding body 2. The elevation drive unit 4M includes a motor, and a mechanism for winding or feeding the elevation belt 40.

The elevation drive unit 4M raises and lowers the holding body 2 to a travel position Pr and a transfer position Pt. The travel position Pr is set to be higher than the transfer position Pt, and is a position at which the holding body 2 is housed in the housing portion 3. The transfer position Pt is set to be lower than the travel position Pr, and is a position at which the holding body 2 is located at a height corresponding to the above-described transfer target position 7.

The holding body 2 includes a main portion 20, and an article holding portion 21 for holding the article 9. The elevation belt 40 is coupled to the main portion 20. The article holding portion 21 is provided in the main portion 20.

Figure 4:
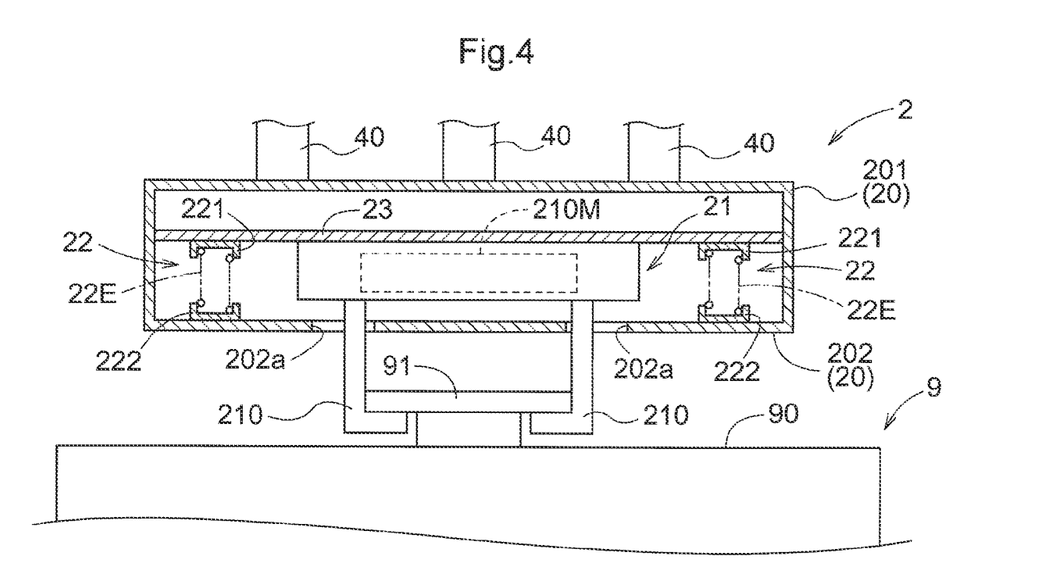
FIG. 4 is a cross-sectional view of a holding body.

As shown in FIG. 4, in the present embodiment, the main portion 20 includes a main body frame portion 201, and a main body bottom portion 202 that is coupled to the main body frame portion 201. The main body frame portion 201 and the main body bottom portion 202 provides a space inside the main portion 20. Various devices are mounted inside the main portion 20. In this example, the above-described article holding portion 21 is provided inside the main portion 20.

As shown in FIGS. 1 and 4, in the present embodiment, the article holding portion 21 includes a pair of gripping claws 210 for gripping the article 9, and a gripping drive unit 210M for driving the pair of gripping claws 210. In this example, the main body bottom portion 202 is provided with holes 202a. The pair of gripping claws 210 penetrate through the holes 202a in the vertical direction, and protrude downward from the main body bottom portion 202 (the main portion 20).

The gripping drive unit 210M is configured to be able to change the orientation of the pair of gripping claws 210 to a gripping orientation in which the pair of gripping claws 210 can grip the article 9 and a gripping release orientation in which the pair of gripping claws 210 releases the article 9. In this example, the gripping drive unit 210M includes a motor and a mechanism for moving the pair of gripping claws 210 closer to each other or away from each other. The gripping drive unit 210M brings the pair of gripping claws 210 into a gripping orientation by moving them closer to each other, and brings the pair of gripping claws 210 into a gripping release orientation by moving them away from each other. The solid line in FIG. 1, and FIG. 4 show a state in which the pair of gripping claws 210 are in the gripping orientation. The dotted line in FIG. 1 shows a state in which the pair of gripping claws 210 are in the gripping release orientation.

In the present embodiment, the article 9 includes an article main portion 90 and a held portion 91 that protrudes upward from an upper portion of the article main portion 90. The held portion 91 is formed in a flange shape. The above-described article holding portion 21 is configured to hold the article 9 by gripping the held portion 91 of the article 9 with the pair of gripping claws 210.

The housing portion 3 houses the article 9 held by the holding body 2 located at the travel position Pr. In the example shown in the figure, the housing portion 3 also houses the elevation drive unit 4M in addition to the holding body 2 and the article 9. Hereinafter, the article 9 held by the holding body 2 located at the travel position Pr and housed in the housing portion 3 may also be simply referred to as a "housed article 9".

In the present embodiment, the housing portion 3 includes side cover portions 31 that cover the housed article 9 from sides (in horizontal directions), and an upper cover portion 32 that covers the housed article 9 from above. In the example shown in the drawings, the pair of side cover portions 31 and the upper cover portion 32 are coupled to each other to form the housing portion 3. The side cover portions 31 extend downward from the two end portions of the upper cover portion 32 in the direction in which the travel path 8 extends (in the travel direction L). That is to say, in this example, the pair of side cover portions 31 cover the article 9 held by the holding body 2, from both sides in the travel direction L.

The article transport vehicle 100 includes shake prevention mechanisms 5 configured to prevent the article 9 housed in the housing portion 3 from shaking in a target direction X that is a direction orthogonal to the vertical direction. In the present embodiment, the target direction X is set to be a direction that extends along the travel path 8, and is equal to the travel direction L.

The shake prevention mechanism 5 includes an abutting portion 50 and an abutting support portion 51 that is coupled to the housing portion 3 and supports the abutting portion 50. In the present embodiment, the shake prevention mechanisms 5 are provided on two sides of the holding body 2 in the target direction X. In other words, the pair of shake prevention mechanisms 5 are provided on two sides of the housed article 9 in the target direction X. In this example, abutting support portions 51 are respectively coupled to the pair of side cover portions 31 of the housing portion 3. The pair of abutting support portions 51 individually support the abutting portions 50. Note that the pair of shake prevention mechanisms 5 have structures that are equivalent to each other.

Figure 2:
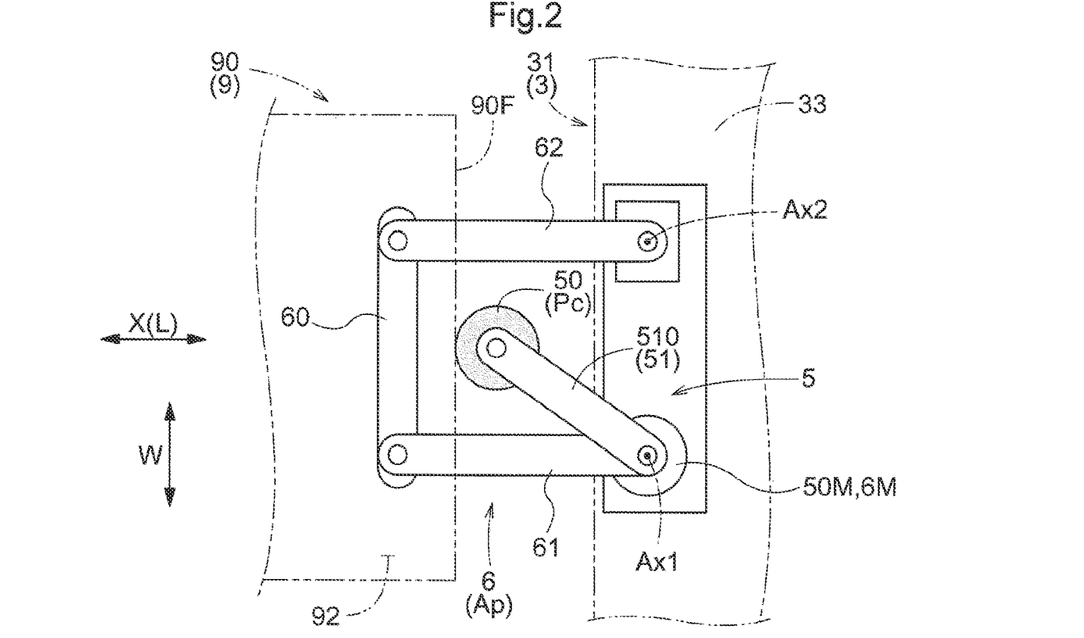
FIG. 2 is a main part plan view showing a state in which an abutting part is located at an abutting position.
Figure 3:
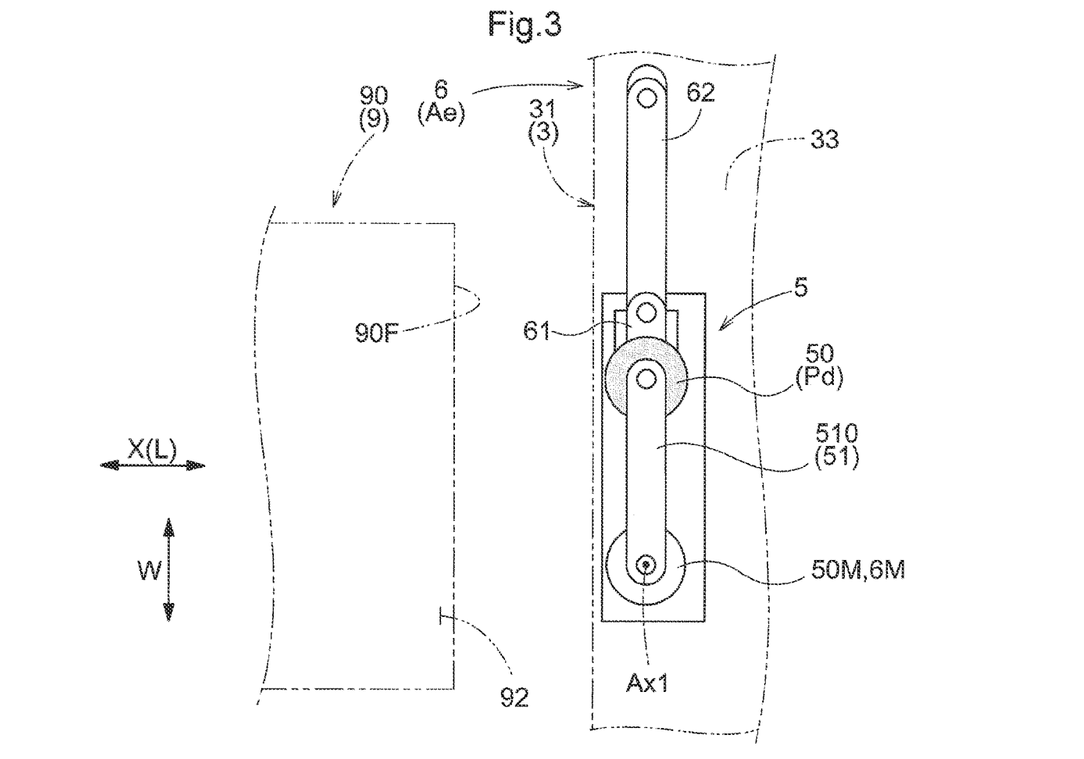
FIG. 3 is a main part plan view showing a state in which the abutting part is located at a separation position.

As shown in FIGS. 2 and 3, each shake prevention mechanism 5 includes an abutting drive unit 50M that changes the position of the abutting portion 50 to an abutting position Pc (see FIG. 2) at which the abutting portion 50 abuts against a side surface 90F of the article 9 housed in the housing portion 3, and a separation position Pd (see FIG. 3) at which the abutting portion 50 is separated from the side surface 90F of the article 9. At least, the abutting drive unit 50M moves the abutting portion 50 between the abutting position Pc and the separation position Pd by changing the position of the abutting portion 50 in the target direction X.

For example, the abutting drive unit 50M may change the position of the abutting portion 50 in the target direction X by linearly moving the abutting portion 50 in the target direction X, or change the position of the abutting portion 50 in the target direction X by swinging the abutting portion 50 about a predetermined axis. Note that the side surfaces 90F of the article 9 are surfaces that face in the target direction X in a state where the article 9 is held by the holding body 2, and are formed on the article main portion 90 in this example.

In the state of being located at the abutting position Pc, the abutting portion 50 abuts against the side surface 90F of the article 9 in the target direction X. In this example, the abutting portion 50 of one shake prevention mechanism 5 of the pair of shake prevention mechanisms 5 abuts against the side surface 90F that faces toward one side of the housed article 9 in the target direction X, and the abutting portion 50 of the other shake prevention mechanism 5 abuts against the side surface 90F that faces toward the other side of the housed article 9 in the target direction X. With such a configuration, it is possible to press the housed article 9 from both sides in the target direction X and prevent the housed article 9 from shaking in the target direction X.

In the present embodiment, each abutting portion 50 is constituted by an elastic member that has a cylindrical outer circumferential surface 50F. In the state of being located at the abutting position Pc, the abutting portion 50 abuts against the side surface 90F of the article 9 on the outer circumferential surface 50F. The elastic member that constitutes the abutting portion 50 may be rubber, a synthetic resin that is elastic, or the like, for example. With the structure in which the abutting portion 50 uses the cylindrical outer circumferential surface 50F thereof to abut against the side surface 90F of the article 9, the abutting portion 50 can abut against the article 9 at a curved surface. Therefore, it is easier to prevent the article 9 from being damaged, or prevent particles from being generated. It is more preferable that the abutting portion 50 is constituted by a member that is less likely to generate particles.

In the present embodiment, the abutting support portions 51 support the abutting portions 50 such that each abutting portion 50 is rotatable about an axis that extends in the vertical direction. With this configuration, even if the article 9 shakes in a direction (a width direction W) that is orthogonal to the target direction X when viewed in the vertical direction, the abutting portions 50 rotate following such movement of the article 9. Therefore, it is possible to suppress the sliding of the article 9 and the abutting portions 50 on each other, and it is easier to prevent the article 9 from being damaged due to such sliding, or prevent particles from being generated due to such sliding.

In the present embodiment, each abutting support portion 51 includes an arm portion 510. The arm portion 510 is coupled to the housing portion 3, and supports the abutting portion 50. In this example, the arm portion 510 is coupled to the housing portion 3 at a base end portion thereof, and supports the abutting portion 50 at a leading end portion thereof. The base end portion of the arm portion 510 is coupled to an attachment member 33 provided in the side cover portion 31, so as to be rotatable about a first axis Ax1 that extends in the vertical direction. The arm portion 510 is configured to be driven by the abutting drive unit 50M so as to rotate about the first axis Ax1.

Also, in the present embodiment, each abutting support portion 51 includes a penetrating portion 511 (see FIG. 6) that penetrates through the abutting portion 50 in the vertical direction. The configuration of the penetrating portion 511 will be described later.

As shown in FIGS. 1 to 3, in the present embodiment, the article transport vehicle 100 includes fall restriction bodies 6 that are located at lower positions than a bottom portion 92 of the article 9 housed in the housing portion 3 and restrict the article 9 housed in the housing portion 3 from falling, and restriction body drive units 6M that change the orientation of the fall restriction bodies 6. Note that the bottom portion 92 of the article 9 is formed at a lower end portion of the article main portion 90.

In the present embodiment, the fall restriction bodies 6 and the restriction body drive units 6M are provided on two sides of the holding body 2 in the target direction X. In other words, two pairs each consisting of a fall restriction body 6 and a restriction body drive unit 6M are respectively provided on two sides of the housed article 9 in the target direction X. Note that two pairs each consisting of a fall restriction body 6 and a restriction body drive unit 6M have structures that are equivalent to each other.

In the present embodiment, the fall restriction bodies 6 are coupled to the housing portion 3. More specifically, the fall restriction bodies 6 are coupled to the attachment members 33 provided in the side cover portions 31 (see FIGS. 2 and 3). In the present embodiment, each fall restriction body 6 is constituted by a link mechanism, and includes a restriction member 60, and a first link 61 and a second link 62 that are coupled to the restriction member 60.

The first link 61 is coupled to the restriction member 60 so as to be rotatable relative to the restriction member 60 about an axis that extends in the vertical direction. The second link 62 is coupled to the restriction member 60 so as to be rotatable about an axis that extends in the vertical direction, at a portion that is separated from a coupling portion where the restriction member 60 and the first link 61 are coupled to each other, in the width direction W. The portion of the first link 61 on the opposite side to the coupling portion where the first link 61 is coupled to the restriction member 60 is coupled to the attachment member 33 so as to be rotatable about the first axis Ax1 that extends in the vertical direction. The portion of the second link 62 on the opposite side to the coupling portion where the second link 62 is coupled to the restriction member 60 is coupled to the attachment member 33 so as to be rotatable about the second axis Ax2 that extends in the vertical direction.

As shown in FIGS. 2 and 3, the restriction body drive unit 6M changes the orientation of the fall restriction body 6 to a protruding orientation Ap (see FIG. 2) in which the fall restriction body 6 protrudes to a position at which the fall restriction body 6 overlaps the bottom portion 92 of the article 9, and a retracted orientation Ae (see FIG. 3) in which the fall restriction body 6 is retracted to a position at which the fall restriction body 6 does not overlap the bottom portion 92 of the article 9, when viewed in the vertical direction. In the examples shown in the drawings, the restriction body drive unit 6M is provided at the coupling portion where the first link 61 and the attachment member 33 (the housing portion 3) are coupled to each other. The restriction body drive unit 6M is configured to pivotally drive the first link 61 about the first axis Ax1. As a result of the first link 61 pivoting about the first axis Ax1, the restriction member 60 moves in the target direction X, and the second link 62 coupled to the restriction member 60 pivots about the second axis Ax2. Thus, the restriction body drive unit 6M can change the orientation of the fall restriction body 6 to the protruding orientation Ap and the retracted orientation Ae. As described above, in this example, the members that constitute the fall restriction body 6 are configured to rotate relative to each other at coupling portions where the members are coupled to each other, about axes that extend in the vertical direction. Therefore, the members can be moved in the horizontal direction, and the range of movement of the fall restriction body 6 is prevented from being large in the vertical direction.

In the present embodiment, the drive source of the abutting drive unit 50M also serves as the drive source of the restriction body drive unit 6M. Specifically, a motor that serves as the drive source provided in the abutting drive unit 50M also serves as the motor that serves as the drive source that is provided in the restriction body drive unit 6M. Such one shared drive source drives to pivot the arm portion 510 about the first axis Ax1 as the abutting drive unit 50M, and drives to pivot the first link 61 about the first axis Ax1 as the restriction body drive unit 6M. With such a configuration, it is possible to simplify the configurations of the abutting drive unit 50M and the restriction body drive unit 6M, and downsize the apparatus compared to the case in which drive sources are individually provided.

Here, the article transport vehicle 100 has the function of mitigating the transmission of vertical vibration to the article 9. Specifically, as shown in FIG. 4, the holding body 2 includes first elastic support portions 22 that each elastically support the article holding portion 21 relative to the main portion 20 in the vertical direction. Each first elastic support portion 22 elastically supports the article holding portion 21. Therefore, it is possible to mitigate the transmission of vertical vibration to the article 9 held by the article holding portion 21. In this example, the holding body 2 includes a plurality of first elastic support portions 22. Note that FIG. 4 shows two first elastic support portions 22.

In the present embodiment, the holding body 2 includes a movable support portion 23 that moves in the vertical direction integrally with the article holding portion 21. The movable support portion 23 is provided so as to be movable within the main portion 20 in the vertical direction, and is coupled to the article holding portion 21. Although not shown in the drawings, it is preferable that the holding body 2 includes a guide member that guides the movement of the movable support portion 23 relative to the main portion 20. An example of such a guide member is a linear movement guide mechanism that guides the movable support portion 23 so as to move linearly in the vertical direction.

In the present embodiment, each first elastic support portion 22 includes a first elastic body 22E that is constituted by a coil spring, a first coupling portion 221 that couples the movable support portion 23 and one end of the first elastic body 22E to each other, and a second coupling portion 222 that couples the main portion 20 (the main body bottom portion 202 in the example shown in the drawings) and the other end of the first elastic body 22E to each other. For example, the first elastic body 22E is constituted by a compression coil spring, and is provided so as to apply a force in a direction to increase the distance between the movable support portion 23 and the main body bottom portion 202 in the vertical direction.

Figure 5:
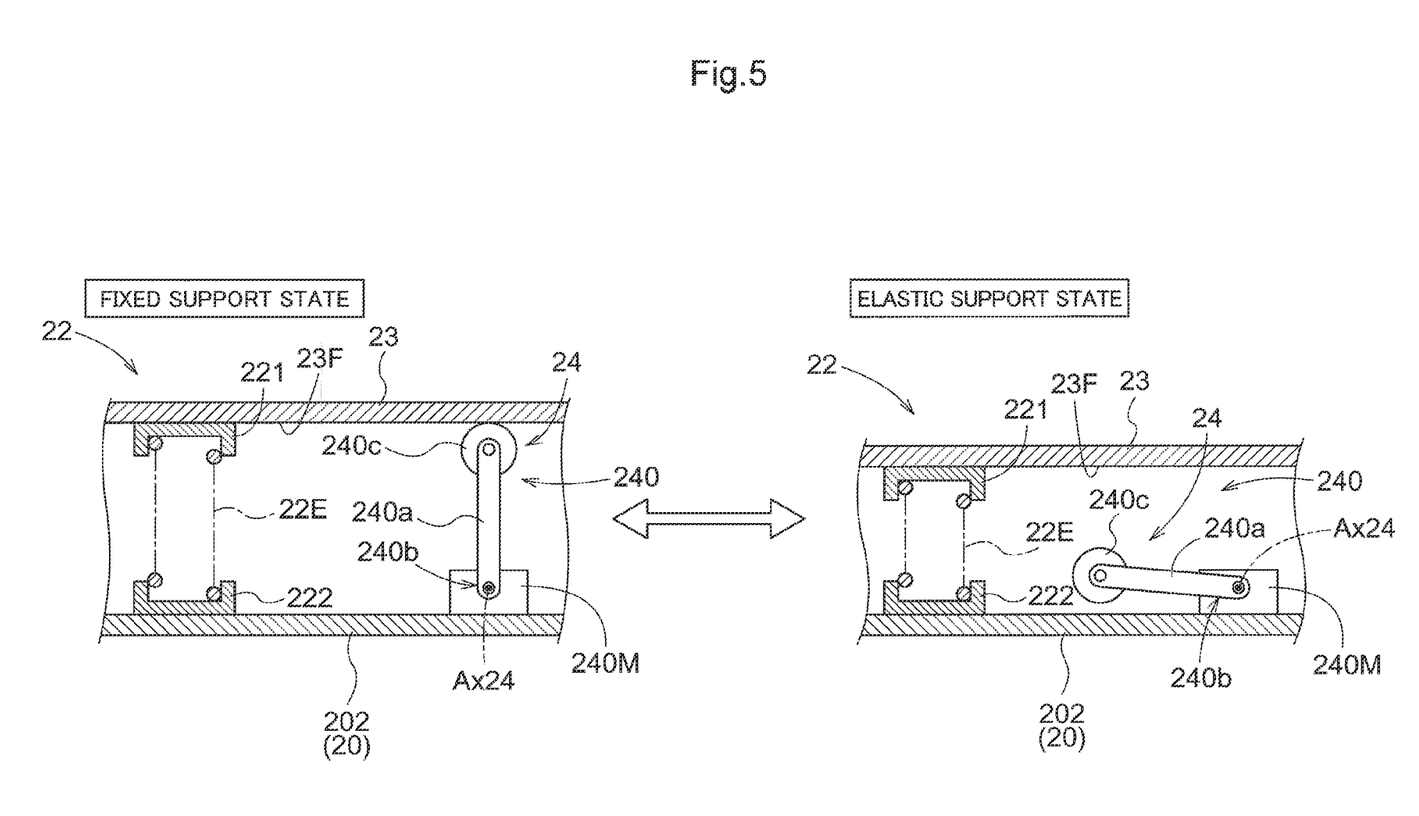
FIG. 5 is a diagram showing a fixed support state and an elastic support state of the article holding portion.

As shown in FIG. 5, in the present embodiment, the holding body 2 includes a support state changing device 24 that changes the support state of the article holding portion 21 to an elastic support state in which the article holding portion 21 is elastically supported by the first elastic support portions 22 relative to the main portion 20, and a fixed support state in which the article holding portion 21 is fixedly supported relative to the main portion 20.

The support state changing device 24 brings the support state of the article holding portion 21 into the fixed support state by fixing the distance between the first coupling portion 221 and the second coupling portion 222 to restrict the first elastic body 22E from elastically deforming. In the present embodiment, the support state changing device 24 includes a fixing portion 240 that fixes the distance between the first coupling portion 221 and the second coupling portion 222. The support state changing device 24 is configured to change the state of the fixing portion 240 to the fixed state and the released state, and realizes the above-described fixed support state in the fixed state, and realizes the above-described elastic support state in the released state.

In the present embodiment, the fixing portion 240 includes a swing body 240a, a swing support portion 240b that supports the swing body 240a so as to be swingable, and a swing drive unit 240M that swings the swing body 240a. The swing drive unit 240M includes a drive source such as a motor, for example.

In the present embodiment, the swing support portion 240b supports the swing body 240a so that the swing body 240a is swingable about a swing axis Ax24 that extends in the horizontal direction. A contact portion 240c that is provided on the swing body 240a is configured to come into contact with a contact surface 23F that is provided on the movable support portion 23 so as to face toward the main body bottom portion 202, and press and pull the contact surface 23F in a direction so that the contact surface 23F moves closer to or away from the main body bottom portion 202, while moving along the contact surface 23F. In this example, the contact portion 240c is a roller that can roll on the contact surface 23F of the movable support portion 23. The contact portion 240c, which is a roller, is configured to roll on the contact surface 23F of the movable support portion 23 to move along the contact surface 23F.

The support state changing device 24 restricts the swing body 240a from swinging, in a state where the contact portion 240c presses the movable support portion 23 in a direction away from the main body bottom portion 202, thereby bringing the fixing portion 240 in the fixed state and fixing the distance between the first coupling portion 221 and the second coupling portion 222. Thus, the support state changing device 24 restricts the first elastic body 22E from elastically deforming, and brings the support state of the article holding portion 21 into the fixed support state. Note that the swing body 240a may be restricted from swinging by locking the swing body 240a so as not to swing, using a stopper or the like, or, for example, by providing the swing support portion 240b with a brake mechanism, or by controlling the output of the drive source (motor) of the swing drive unit 240M.

The support state changing device 24 brings the fixing portion 240 into the released state by bringing the contact portion 240c into a state in which the contact portion 240c is separated from the contact surface 23F of the movable support portion 23, thereby allowing the distance between the first coupling portion 221 and the second coupling portion 222 to change. Thus, the support state changing device 24 allows the first elastic body 22E to elastically deform, and brings the support state of the article holding portion 21 into the elastic support state. In the elastic support state, upon the distance between the first coupling portion 221 and the second coupling portion 222 being changed, the first elastic body 22E expands and contracts in response to the vertical movement of the movable support portion 23. Thus, it is possible to mitigate the transmission, in the vertical direction, of vibration to the article 9 held by the article holding portion 21 that moves upward and downward integrally with the movable support portion 23.

In addition, in the article transport vehicle 100, the abutting portion 50 that abuts against the side surface 90F of the article 9 held by the article holding portion 21, in the target direction X, is also elastically movable in the vertical direction in the state of being in contact with the side surface 90F of the article 9. Hereinafter, a detailed description will be given.

Figure 6:
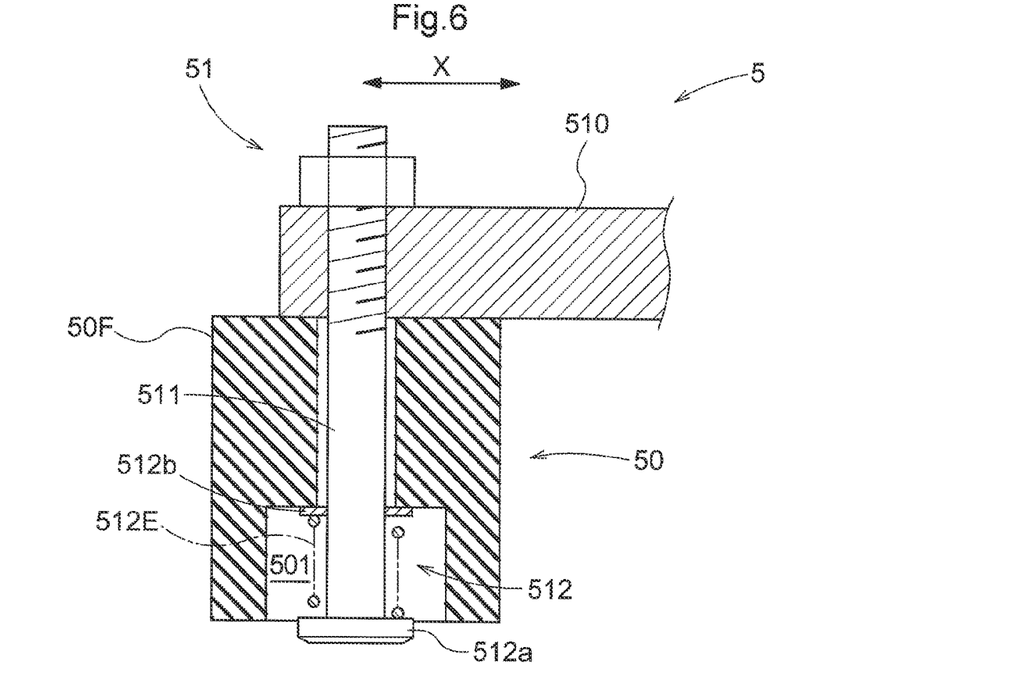
FIG. 6 is a diagram showing a configuration of an abutting support portion.

As shown in FIG. 6, the abutting support portion 51 includes a second elastic support portion 512 that elastically supports the abutting portion 50 relative to the housing portion 3 (see FIG. 1, etc.) in the vertical direction. As described above, in the present embodiment, each abutting support portion 51 includes the arm portion 510 and the penetrating portion 511 that is provided at the leading end portion of the arm portion 510 and penetrates through the abutting portion 50 in the vertical direction. In this example, the second elastic support portion 512 is provided around the penetrating portion 511. Specifically, a space 501 in which a portion of the penetrating portion 511 is located is formed within the abutting portion 50, and the second elastic support portion 512 is provided around the penetrating portion 511 within the space 501. In this way, the second elastic support portion 512 is located inside the abutting portion 50. Therefore, it is easier to downsize the shake prevention mechanism 5.

In the present embodiment, the second elastic support portion 512 includes a second elastic body 512E. In this example, the second elastic body 512E is formed as a coil spring, and more specifically, it is formed as a compression coil spring.

In the present embodiment, the second elastic support portion 512 includes a third coupling portion 512a that couples one end of the second elastic body 512E and the abutting support portion 51 (the penetrating portion 511 in this example) to each other, and a fourth coupling portion 512b that couples the other end of the second elastic body 512E and the abutting portion 50 to each other. In the present embodiment, the third coupling portion 512a is a flange-shaped portion that is formed so as to be integrated with the penetrating portion 511 of the abutting support portion 51. In the example shown in the drawings, the penetrating portion 511 is formed using a bolt that is screwed into the arm portion 510, and the head of the bolt is the fourth coupling portion 512b. The third coupling portion 512a is not movable relative to the penetrating portion 511. On the other hand, the fourth coupling portion 512b is coupled to the abutting portion 50 so as to be movable relative to the penetrating portion 511 in the vertical direction. The third coupling portion 512a and the fourth coupling portion 512b are provided with a distance therebetween in the vertical direction, and the second elastic body 512E is provided therebetween. In this example, the second elastic body 512E, which is a coil spring, is provided so as to be sandwiched between the third coupling portion 512a and the fourth coupling portion 512b.

The third coupling portion 512a is in contact with one end of the second elastic body 512E from below. Also, the fourth coupling portion 512b is provided at the upper end of the space 501 in the abutting portion 50. In the space 501, the fourth coupling portion 512b is in contact with a portion of the abutting portion 50 from below, and is in contact with the other end of the second elastic body 512E from above. The fourth coupling portion 512b is pressed against, and is locked to, the abutting portion 50 due to the biasing force of the second elastic body 512E. With such a configuration, the fourth coupling portion 512b is pressed by the abutting portion 50 from above to contract the second elastic body 512E, and when the force applied by the abutting portion 50 from above is reduced, the fourth coupling portion 512b is pressed upward by the second elastic body 512E to expand the second elastic body 512E. That is to say, the second elastic body 512E contracts and expands in response to the vertical movement of the abutting portion 50. Such vertical movement of the abutting portion 50 is caused as a result of vertical vibration of the article 9 against which the abutting portion 50 abuts. Therefore, when the article 9 held by the article holding portion 21 is elastically moved in the vertical direction, the second elastic support portion 512 also allows the abutting portion 50 that abuts against the article 9 to elastically move in the vertical direction. Consequently, it is possible to enable the first elastic support portion 22 of the holding body 2 to properly achieve the function thereof of mitigating the transmission of vertical vibration to the article 9. In the present embodiment, "coupling" of the third coupling portion 512a and the fourth coupling portion 512b indicates a state in which each of them is pressed against, and is locked to, a coupling target due to the biasing force of the second elastic body 512E. Note that either one or both of the third coupling portion 512a and the fourth coupling portion 512b may be configured to couple the second elastic body 512E integrally with the coupling target, using welding, fitting, or the like.

In the present embodiment, the spring constant of the second elastic bodies 512E is set to be lower than the spring constant of the first elastic bodies 22E. With this configuration, the abutting portions 50 are more likely to elastically move in the vertical direction compared to the article 9 and the article holding portion 21. Therefore, it is possible to appropriately secure the followability of the abutting portions 50 with respect to the elastic movement of the article 9 in the vertical direction. Therefore, it is possible to prevent the contact portions 50 from hindering the function of the first elastic support portions 22 of mitigating the transmission of vertical vibration to the article 9, and it is possible to enable the first elastic support portions 22 to achieve the function thereof more properly.

Figure 7:
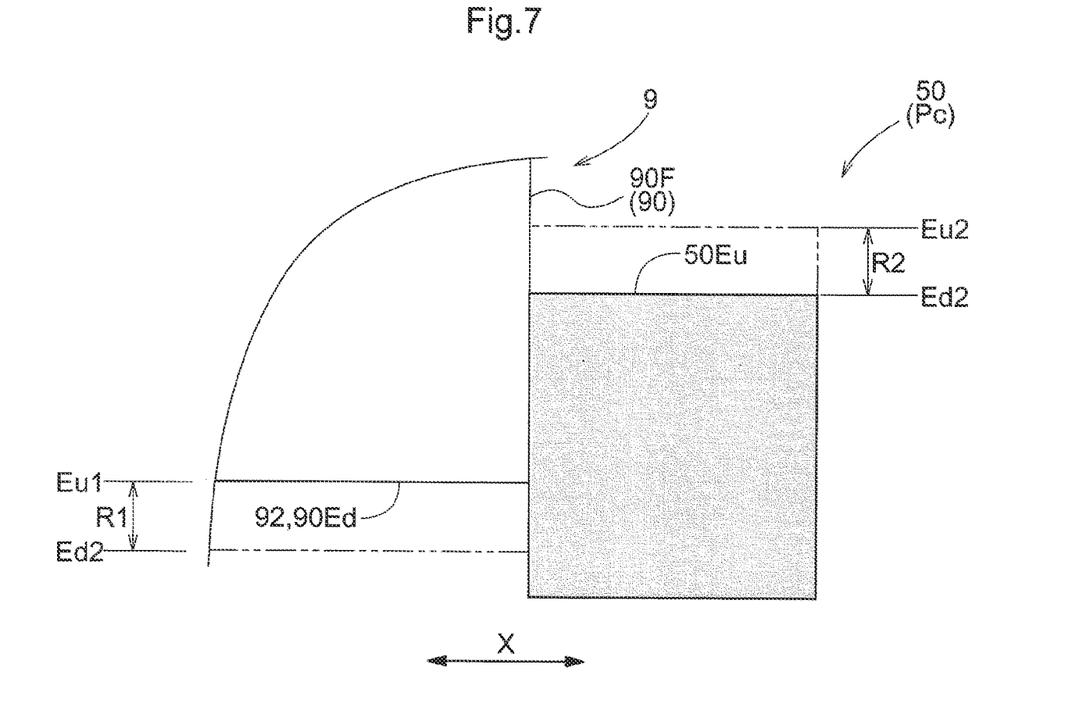
FIG. 7 is a diagram showing a positional relationship between an article and the abutting portion.

Next, the positional relationship between the housed article 9 and the abutting portion 50 located at the abutting position Pc will be described.

As shown in FIG. 7, in this example, the vertical range in which a lower end 90Ed of the article 9 housed in the housing portion 3 (the housed article 9) can be elastically moved by the first elastic support portion 22 is defined as a first elastic movement range R1, and the vertical range in which an upper end 50Eu of the abutting portion 50 abutting against the side surface 90F of the article 9 can be elastically moved by the second elastic support portion 512 is defined as a second elastic movement range R2. In this example, an upper limit position Eu1 of the first elastic movement range R1 is set to be lower than the lower limit position Ed2 of the second elastic movement range R2. As a matter of course, a lower limit position Ed1 of the first elastic movement range R1 is set to be lower than the upper limit position Eu2 of the second elastic movement range R2. With such a configuration, the position of the lower end 90Ed of the article 9 is invariably lower than the upper end 50Eu of the abutting portion 50. Therefore, the article 9 does not move up the abutting portion 50 because of the vertical movement of the housed article 9 caused by the first elastic support portion 22 or the vertical movement of the abutting portion 50 caused by the second elastic support portion 512. Therefore, it is possible to prevent the shake prevention mechanism 5 from not functioning properly as a result of the article 9 moving up the abutting portion 50.

Other Embodiments

Next, other embodiments of an article transport vehicle will be described.

(1) The above embodiment describes an example in which the target direction X is set to be a direction that extends along the travel path 8, and is equal to the travel direction L. However, the present invention is not limited to such an example, and the target direction X may be set to be a direction (width direction W) that is orthogonal to the travel direction L when viewed in the vertical direction. If this is the case, the abutting portions 50 are provided in the width direction W with respect to the housed article 9, and are configured to prevent the housed article 9 from shaking in the width direction W.

(2) The above embodiment describes an example in which each abutting portion 50 is constituted by an elastic member that has a cylindrical outer circumferential surface 50F. However, the present invention is not limited to such an example, and each abutting portion 50 may have a spherical outer circumferential surface 50F or a polygonal cylinder-shaped outer circumferential surface 50F. Also, the abutting portion 50 may be constituted by a rigid member.

(3) The above embodiment describes an example in which each abutting support portion 51 supports the abutting portion 50 so that the abutting portion 50 is rotatable about an axis that extends in the vertical direction. However, the present invention is not limited to such an example, and each abutting support portion 51 may support the abutting portion 50 so that the abutting portion 50 is not rotatable about an axis that extends in the vertical direction.

(4) The above embodiment describes an example in which the abutting support portions 51 are coupled to the side cover portions 31 of the housing portion 3. However, the present invention is not limited to such an example, and the abutting support portions 51 may be coupled to the upper cover portion 32 of the housing portion 3.

(5) The above embodiment describes an example in which the restriction body drive unit 6M is provided at the coupling portion where the first link 61 and the attachment member 33 (the housing portion 3) are coupled to each other. However, the restriction body drive unit 6M may be provided at the coupling portion where the second link 62 and the attachment member 33 (the housing portion 3) are coupled to each other.

(6) The above embodiment describes an example in which the fall restriction body 6 is constituted by a link mechanism. However, the present invention is not limited to such an example, and the fall restriction body 6 may cause the restriction member 60 to move linearly or swing, using a cylinder or the like, for example.

(7) The above embodiment describes an example in which the drive sources of the abutting drive units 50M also serve as the drive sources of the restriction body drive units 6M. However, the present invention is not limited to such an example, and the drive sources of the abutting drive units 50M and the drive sources of the restriction body drive units 6M may be individually provided.

(8) The above embodiment describes an example in which the article transport vehicle 100 is provided with the fall restriction bodies 6. However, the article transport vehicle 100 need not be necessarily provided with such fall restriction bodies 6.

(9) The above embodiment describes an example in which both the first elastic body 22E and the second elastic body 512E are constituted by coil springs, specifically compression coil springs. However, the present invention is not limited to such an example, and at least either the first elastic bodies 22E or the second elastic bodies 512E may be constituted by another kind of spring such as a tension coil spring, a torsion coil spring, or a leaf spring, or another kind of elastic body such as rubber or a synthetic resin.

(10) The above embodiment describes an example in which the spring constant of the second elastic bodies 512E is set to be lower than the spring constant of the first elastic bodies 22E. However, the present invention is not limited to such an example, and the spring constant of the second elastic bodies 512E may be set to be equivalent to the spring constant of the first elastic bodies 22E, or set to be higher than the spring constant of the first elastic bodies 22E.

(11) The above embodiment describes an example in which, the contact portion 240c of each support state changing device 24 is formed as a roller that can roll on the contact surface 23F of the movable support portion 23. However, the present invention is not limited to such an example, and it is possible to employ a configuration in which a linear motion block is provided at the portion corresponding to the contact portion 240c and a linear motion rail is provided on the movable support portion 23 so that the linear motion block travels on the linear motion rail as the swing body 240a swings.

(12) The above embodiment describes an example in which the holding body 2 includes a support state changing device 24 that changes the support state of the article holding portion 21 in the elastic support state and the fixed support state. However, the holding body 2 need not necessarily include such a support state changing device 24.

(13) The above embodiment describes an example in which the article transport vehicle 100 is configured to raise and lower the holding body 2, and is configured to be able to transfer the article 9 to and from the transfer target position 7 that is located below the travel rail 80. However, the present invention is not limited to such an example, and the article transport vehicle 100 need not necessarily have the function of raising and lowering the holding body 2. If this is the case, the transfer target position 7 may be located away from the travel rail 80 in the horizontal direction at a height that is equivalent to the height of the travel rail 80, and the article transport vehicle 100 may be configured to transfer the article 9 to and from the above-described transfer target position 7 by moving the holding body 2 in the horizontal direction.

(14) The above embodiment describes an example in which the article transport vehicle 100 is configured as a so-called ceiling transport vehicle. However, the present invention is not limited to such an example, and the article transport vehicle 100 need only transport the article 9 that is supported in a suspended state, and may be configured as a transport vehicle that transports the article 9 near the floor surface.

(15) The configurations disclosed in the above-described embodiment can be applied in combination with the configurations disclosed in the other embodiments as long as no contradiction arises. With respect to other configurations, the embodiments disclosed herein are merely exemplary in all respects. Therefore, various modifications can be made as appropriate without departing from the spirit of the present disclosure.

Summary of Above-Described Embodiment

The following describes the article transport vehicle described above.

An article transport vehicle that transports an article, including:
- a travel body configured to travel along a travel path;
- a holding body coupled to the travel body and configured to hold the article such that the article is in a state of being suspended therefrom;
- a housing portion coupled to the travel body and configured to house the article held by the holding body; and
- a shake prevention mechanism configured to prevent the article housed in the housing portion from shaking in a target direction that is a direction orthogonal to a vertical direction,
- wherein the holding body includes a main portion, an article holding portion configured to hold the article, and a first elastic support portion configured to elastically support the article holding portion in the vertical direction relative to the main portion,
- the shake prevention mechanism includes an abutting portion, an abutting support portion coupled to the housing portion and supporting the abutting portion, and an abutting drive unit configured to change a position of the abutting portion to an abutting position at which the abutting portion abuts against a side surface of the article housed in the housing portion and a separation position at which the abutting portion is separated from the side surface, and
- the abutting support portion includes a second elastic support portion configured to elastically support the abutting portion in the vertical direction relative to the housing portion.

With this configuration, the abutting portion of the shake prevention mechanism abuts against the side surface of the article held by the holding body, and consequently the shake of the article in the target direction can be suppressed. Therefore, it is possible to stably hold the article. In addition, the abutting support portion that supports the abutting portion includes a second elastic support portion configured to elastically support the abutting portion in the vertical direction relative to the housing portion. Therefore, when the article holding portion elastically supported by the first elastic support portion in the vertical direction elastically moves in the vertical direction, i.e., when the article held by the article holding portion elastically moves in the vertical direction, the abutting portion abutting against the article can also elastically move in the vertical direction to follow the article. Therefore, it is possible to enable the first elastic support portion of the holding body to properly achieve the function thereof of mitigating the transmission of vertical vibration to the article.

Here, it is preferable that,
when a vertical range in which a lower end of the article housed in the housing portion is capable of being elastically moved by the first elastic support portion is defined as a first elastic movement range, and a vertical range in which an upper end of the abutting portion abutting against the side surface of the article is capable of being elastically moved by the second elastic support portion is defined as a second elastic movement range,
the first elastic movement range has an upper limit position that is set to be lower than a lower limit position of the second elastic movement range.

With this configuration, the lower end position of the article is invariably lower than the upper end position of the abutting portion. Therefore, it is possible to prevent the shake prevention mechanism from not functioning properly as a result of the article moving up the abutting portion.

In addition, it is preferable that the first elastic support portion includes a first elastic body,
the second elastic support portion includes a second elastic body, and
the second elastic body has a spring constant that is set to be lower than a spring constant of the first elastic body.

With this configuration, the abutting portion is more likely to elastically move in the vertical direction compared to the article and the article holding portion. Therefore, it is possible to appropriately secure the followability of the abutting portion with respect to the elastic movement of the article in the vertical direction. Consequently, it is possible to prevent the contact portion from hindering the function of the first elastic support portion of mitigating the transmission of vertical vibration to the article, and it is possible to enable the first elastic support portion to achieve the function thereof more properly.

In addition, it is preferable that
the abutting support portion includes a penetrating portion that penetrates through the abutting portion in the vertical direction, and
the second elastic support portion is provided around the penetrating portion.

With this configuration, it is possible to provide the second elastic support portion inside the abutting portion, and therefore it is easier to downsize the shake prevention mechanism.

In addition, it is preferable that
the abutting portion is constituted by an elastic member that has a cylindrical outer surface, and, in a state of being located at the abutting position, the abutting portion abuts against the side surface of the article on the outer circumferential surface, and
the abutting support portion supports the abutting portion such that the abutting portion is rotatable about an axis that extends in the vertical direction.

With this configuration, it is possible to suppress the sliding of the article and the abutting portion on each other. Therefore, it is easier to prevent the article from being damaged due to such sliding, or prevent particles from being generated due to such sliding.

In addition, it is preferable that the article transport vehicle further includes:
- a fall restriction body located at a lower position than a bottom portion of the article housed in the housing portion, and configured to restrict the article housed in the housing portion from falling; and
- a restriction body drive unit configured to change an orientation of the fall restriction body to a protruding orientation in which the fall restriction body protrudes to a position at which the fall restriction body overlaps the bottom portion, and a retracted orientation in which the fall restriction body is retracted to a position at which the fall restriction body does not overlap the bottom portion, in a vertical view that is a view in the vertical direction,
- wherein the abutting drive unit has a drive source that also serves as a drive source of the restriction body drive unit.

With this configuration, it is possible to prevent the article from falling, using the fall restriction body. Also, the drive source of the abutting drive unit also serves as the drive source of the restriction body drive unit, and therefore it is possible to simplify the configurations of these two drive units.

In addition, it is preferable that the holding body includes a support state changing device configured to change a support state of the article holding portion to an elastic support state in which the article holding portion is elastically supported by the first elastic support portion relative to the main portion, and a fixed support state in which the article holding portion is fixedly supported relative to the main portion.

With this configuration, when the article is to be allowed to elastically move in the vertical direction, the support state of the article holding portion can be set to the elastic support state, using the support state changing device. Also, when the article is to be restricted from elastically moving in the vertical direction, the support state of the article holding portion can be set to the fixed support state, using the support state changing device. Therefore, with this configuration, it is possible to appropriately change the article holding state according to the transport status of the article.

Also, in the configuration in which the holding body includes the support state changing device, it is preferable that
the holding body includes a movable support portion configured to move in the vertical direction integrally with the article holding portion,
wherein the first elastic support portion includes a first elastic body that is constituted by a coil spring, a first coupling portion that couples the movable support portion and one end of the first elastic body to each other, and a second coupling portion that couples the main portion and the other end of the first elastic body to each other, and
the support state changing device is configured to bring the support state of the article holding portion into the fixed support state by fixing a distance between the first coupling portion and the second coupling portion to restrict the first elastic body from elastically deforming.

With this configuration, it is possible to change the support state of the article holding portion to the elastic support state and the fixed support state, using a relatively simple configuration.

INDUSTRIAL APPLICABILITY

The techniques according to the present disclosure can be used in an article transport vehicle that transports articles.

What is claimed is:

1. An article transport vehicle that transports an article, comprising:
a travel body configured to travel along a travel path;
a holding body coupled to the travel body and configured to hold the article such that the article is suspended therefrom;
a housing portion coupled to the travel body and configured to house the article held by the holding body; and
a shake prevention mechanism configured to prevent the article housed in the housing portion from shaking in a target direction that is a direction orthogonal to a vertical direction,
wherein;
the holding body comprises a main portion, an article holding portion configured to hold the article, and a first elastic support portion configured to elastically support the article holding portion in the vertical direction relative to the main portion,
the shake prevention mechanism comprises an abutting portion, an abutting support portion coupled to the housing portion and supporting the abutting portion, and an abutting drive unit configured to change a position of the abutting portion to an abutting position at which the abutting portion abuts against a side surface of the article housed in the housing portion and a separation position at which the abutting portion is separated from the side surface, and
the abutting support portion comprises a second elastic support portion configured to elastically support the abutting portion in the vertical direction relative to the housing portion,
wherein when a vertical range in which a lower end of the article housed in the housing portion is configured to be elastically moved by the first elastic support portion is defined as a first elastic movement range,
wherein the vertical range in which an upper end of the abutting portion abutting against the side surface of the article is configured to be elastically moved by the second elastic support portion is defined as a second elastic movement range, and
wherein the first elastic movement range has an upper limit position that is set to be lower than a lower limit position of the second elastic movement range.

2. The article transport vehicle according to claim 1, wherein:
the first elastic support portion comprises a first elastic body,
the second elastic support portion comprises a second elastic body, and
the second elastic body has a spring constant that is set to be lower than a spring constant of the first elastic body.

3. The article transport vehicle according to claim 1, wherein the abutting support portion comprises a penetrating portion that penetrates through the abutting portion in the vertical direction, and
wherein the second elastic support portion is provided around the penetrating portion.

4. The article transport vehicle according to claim 1, wherein the abutting portion comprises an elastic member that has a cylindrical outer surface, and, when the abutting portion is located at the abutting position, the abutting portion abuts against the side surface of the article on the cylindrical outer surface, and
wherein the abutting support portion supports the abutting portion such that the abutting portion is rotatable about an axis that extends in the vertical direction.

5. The article transport vehicle according to claim 1, further comprising:
a fall restriction body located at a lower position than a bottom portion of the article housed in the housing portion, and configured to restrict the article housed in the housing portion from falling; and
a restriction body drive unit configured to change an orientation of the fall restriction body to a protruding orientation in which the fall restriction body protrudes to a position at which the fall restriction body overlaps the bottom portion, and a retracted orientation in which the fall restriction body is retracted to a position at which the fall restriction body does not overlap the bottom portion, in a vertical view that is a view in the vertical direction, and
wherein the abutting drive unit has a drive source that also serves as a drive source of the restriction body drive unit.

6. The article transport vehicle according to claim 1, wherein the holding body comprises a support state changing device configured to change a support state of the article holding portion to an elastic support state in which the article holding portion is elastically supported by the first elastic support portion relative to the main portion, and a fixed support state in which the article holding portion is fixedly supported relative to the main portion.

7. The article transport vehicle according to claim 6,
wherein the holding body comprises a movable support portion configured to move in the vertical direction integrally with the article holding portion,
wherein the first elastic support portion comprises a first elastic body that is a coil spring, a first coupling portion that couples the movable support portion and one end of the first elastic body to each other, and a second coupling portion that couples the main portion and the other end of the first elastic body to each other, and
wherein the support state changing device is configured to bring the support state of the article holding portion into the fixed support state by fixing a distance between the first coupling portion and the second coupling portion to restrict the first elastic body from elastically deforming.

* * * * *